United States Patent
Karasawa et al.

(10) Patent No.: US 7,161,248 B2
(45) Date of Patent: Jan. 9, 2007

(54) MULTI-LAYER WIRING STRUCTURE WITH DUMMY PATTERNS FOR IMPROVING SURFACE FLATNESS

(75) Inventors: Toshiyuki Karasawa, Kawasaki (JP); Satoshi Otsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 10/898,167

(22) Filed: Jul. 26, 2004

(65) Prior Publication Data

US 2005/0212136 A1    Sep. 29, 2005

(30) Foreign Application Priority Data

Mar. 29, 2004    (JP)    ............... 2004-095535

(51) Int. Cl.
  *H01L 23/48*    (2006.01)
(52) U.S. Cl. ............ 257/758; 257/531; 257/516; 257/200; 438/381
(58) Field of Classification Search ........ 257/516, 257/531, 758
See application file for complete search history.

(56) References Cited

U.S. PATENT DOCUMENTS

| 2002/0036335 | A1* | 3/2002 | Minami ............ 257/531 |
| 2003/0039879 | A1 | 2/2003 | Ovshinsky et al. |
| 2004/0084777 | A1* | 5/2004 | Yamanoue et al. ....... 257/758 |

FOREIGN PATENT DOCUMENTS

JP    2003-140319    5/2003

\* cited by examiner

*Primary Examiner*—Michael Trinh
*Assistant Examiner*—Tsz Kit Chiu
(74) *Attorney, Agent, or Firm*—Westerman, Hattori, Daniels & Adrian, LLP.

(57) ABSTRACT

A first area, a ring shape second area surrounding the first area, and a third area surrounding the second area are defined on the surface of a support substrate. A first wiring layer is disposed above the support substrate. A wiring is formed in the third area, dummy patterns being formed in the second area, and conductive patterns are not formed in the first area. A functional element is disposed above the first wiring layer and in the first area.

13 Claims, 9 Drawing Sheets

MULTI-LAYER WIRING STRUCTURE WITH DUMMY PATTERNS FOR IMPROVING SURFACE FLATNESS

CROSS REFERENCE TO RELATED APPLICATION

This application is based on and claims priority of Japanese Patent Application No. 2004-095535 filed on Mar. 29, 2004, the entire contents of which are incorporated herein by reference.

BACKGROUND OF THE INVENTION

A) Field of the Invention

The present invention relates to a multi-layer wiring structure, and more particularly to a multi-layer wiring structure having dummy patterns for improving flatness of the surface of a wiring layer.

B) Description of the Related Art

Brief description will be made on a damascene method of forming multi-layer wiring of a semiconductor integrated circuit device. After an interlayer insulating film is formed, wiring trenches and via holes are formed in the interlayer insulating film. A conductive film of copper or the like is formed to fill the via holes and wiring trenches with the conductive film. If necessary, a barrier metal layer is formed to prevent diffusion of copper. The conductive film is polished using chemical mechanical polishing (CMP) to remove an unnecessary region of the conductive film and leave the conductive film only in the via holes and wiring trenches. This process is repeated to form a multi-layer wiring structure.

If the pattern density of a wiring layer is not uniform, the surface flatness after CMP is likely to be degraded. Depending upon the polishing conditions, the area having a low pattern density is polished easier than the area having a high pattern density, so that an erosion is likely to be formed in the area having the low pattern density. The invention disclosed in Japanese Patent Laid-open Publication No. 2003-140319 adopts the structure that dummy patterns are disposed in an area having a low pattern density to make effective pattern densities have nearly uniform values.

Related art is disclosed in U.S. Patent Laid-open Publication No. 2003/39879.

In a semiconductor integrated circuit device having an inductor, if conductive patterns are formed near the inductor, the electric characteristics of the inductor are altered. In order to stabilize the electric characteristics of an inductor, wiring lines are not generally disposed just under the inductor. Further, it is not appropriate to dispose conductive dummy patterns just under an inductor.

The pattern density of an area of a wiring layer under the inductor becomes therefore low so that erosion is likely to be formed in this area. If erosion is formed, a margin of photography lowers. Further, after CMP for leaving wiring of the damascene structure, conductive material is left in some cases in the area where erosion is formed.

These problems occur not only when a functional element formed on an upper layer is an inductor but also when a functional element is formed which does not allow a conductive pattern to be formed just under the functional element.

SUMMARY OF THE INVENTION

An object of this invention is to provide a multi-layer wiring structure capable of improving the flatness of a surface after CMP even if there is an area not allowed to form conductive patterns.

According to one aspect of the present invention, there is provided a multi-layer wiring structure comprising: a support substrate, on a surface of which a first area, a loop shape second area surrounding the first area, and a third area surrounding the second area are defined; a first wiring layer disposed above the support substrate, a wiring being formed in the third area, dummy patterns being formed in the second area, and conductive patterns are not formed in the first area; and a functional element disposed above the first wiring layer and in the first area.

According to another aspect of the present invention, there is provided a multi-layer wiring structure comprising: a support substrate having a loop shape first area, a second area surrounding the first area, and a third area surrounded by the first area, respectively defined on a surface of the support substrate; a first wiring layer disposed above the support substrate, a wiring being formed in the second area, dummy patterns being formed in the third area, and conductive patterns are not formed in the first area; and a functional element disposed above the first wiring layer and in the first area.

Since conductive patterns are not formed in the first area where a functional element is disposed, the influence of the conductive patterns upon the functional element can be eliminated. By disposing dummy patterns in the second or fourth areas, the flatness of a surface after CMP can be improved.

DESCRIPTION OF THE PREFERRED EMBODIMENTS

Figure 1:
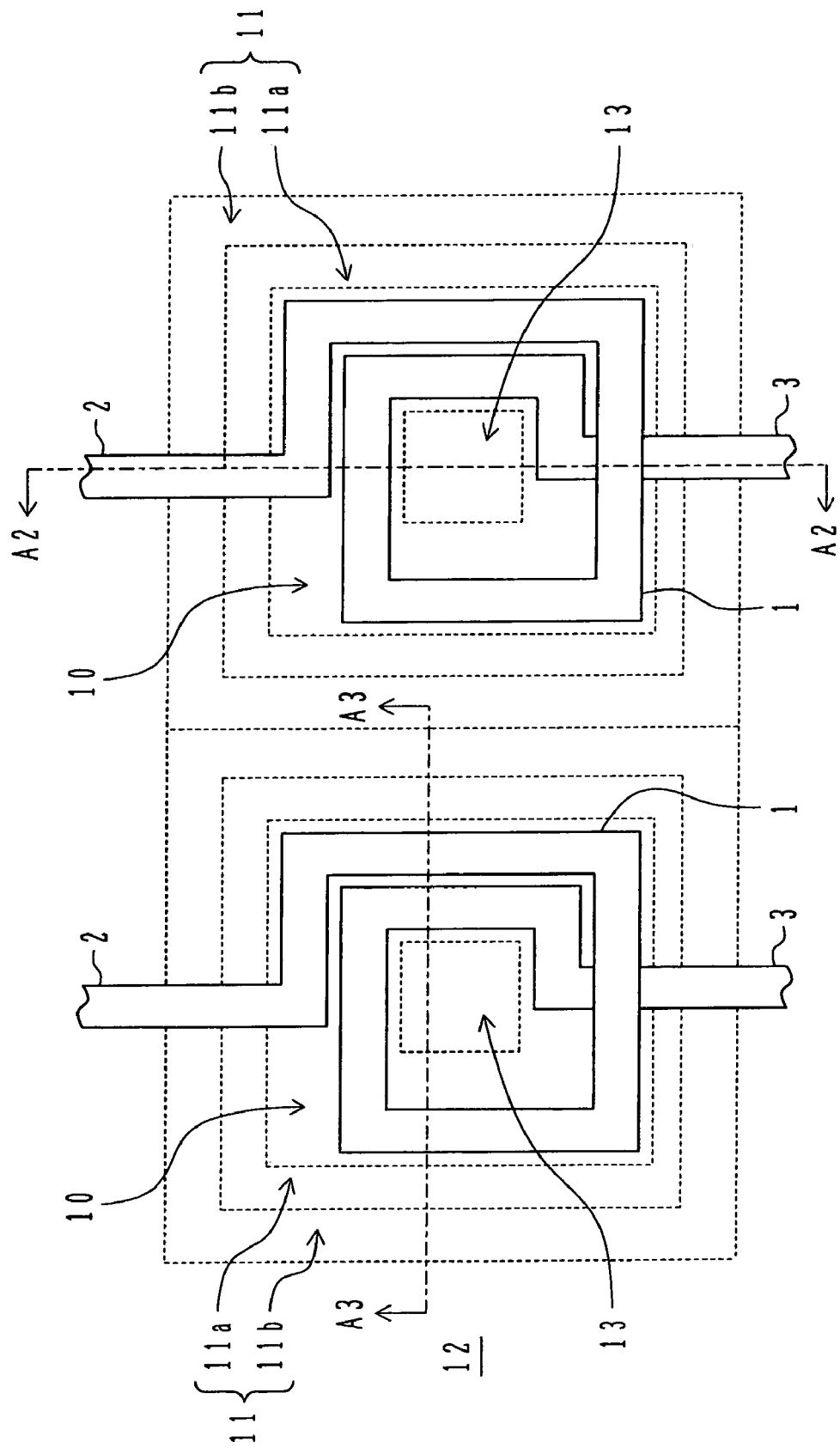
FIG. 1 is a plan view of a semiconductor device having a multi-layer wiring structure according to an embodiment.

FIG. 1 is a partial plan view of a semiconductor device having a multi-layer wiring structure according to an embodiment. A loop-shape first area 10 where an inductor is disposed is defined on a substrate surface. In the outer area of the first area 10, a second area 11 is defined surrounding the first area 10. The second area 11 has a first sub area 11a (an inner peripheral side thereof) of the first area 10 and a second sub area 11b outside of the first sub area 11a (an outer peripheral side thereof).

An inner periphery of the first area 10, a border between the first area 10 and the second area 11, a border between the first sub area 11a and the second sub area 11b, and an outer periphery of the second area 11 have, for example, a square shape or a rectangle shape. If a plurality of inductors are disposed, a plurality of second areas 11 are defined. Two second areas 11 are disposed in contact with each other by sharing a portion of the outer peripheries thereof.

A third area 12 where actual wirings are disposed is defined outside of the second areas 11. A fourth area 13 is defined having an outer periphery that coincides with the inner periphery of the first area 10 in position and form. The two second areas 11 may be disposed separately and the third area 12 is inserted therebetween.

The length of a side of the outer periphery of the first area 10 is, for example, 200 μm. In this case, for example, the width of the second area 11 is 100 μm, and the length of a side of the inner periphery of the first area 10 (outer periphery of the fourth area 13) is 100 μm.

An inductor 1 is disposed in the first area 10. The inductor 1 has a spiral shape surrounding the fourth area 13. In the example shown in FIG. 1, the number of turns of each inductor 11 is about 1.5. The end of the inductor 1 on the outer side is continuous with a lead 2, and the end on the inner side is continuous with another lead 3. The lead 3 continuous with the end on the inner side is disposed in a wiring layer lower than the wiring layer having the inductor 1 disposed therein, and extends outside of the inductor 1 by crossing the inductor 1 with an underpass.

Figure 2:
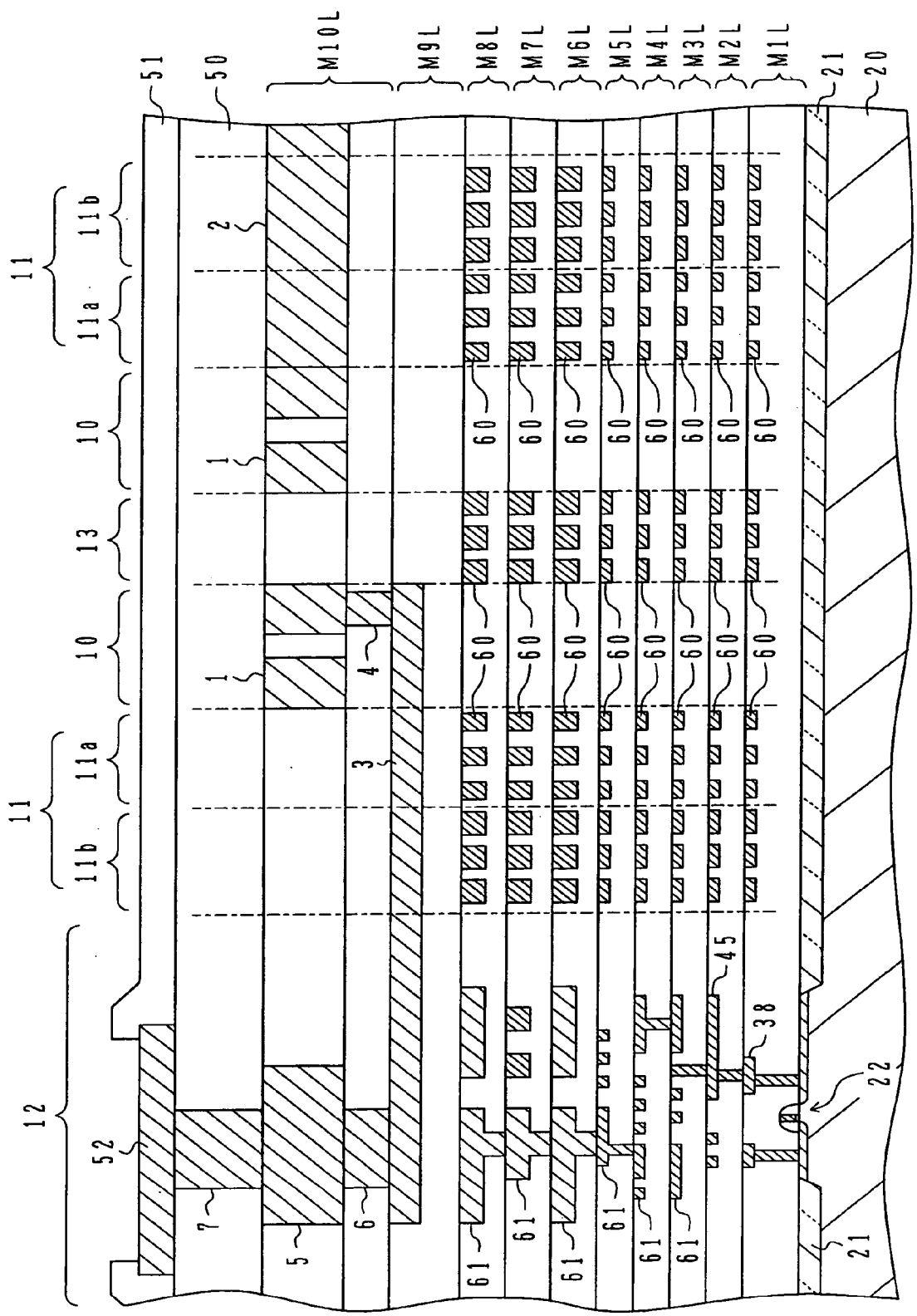
FIG. 2 is a cross sectional view taken along one-dot chain line A2—A2 shown in the plan view of FIG. 1.
Figure 3:
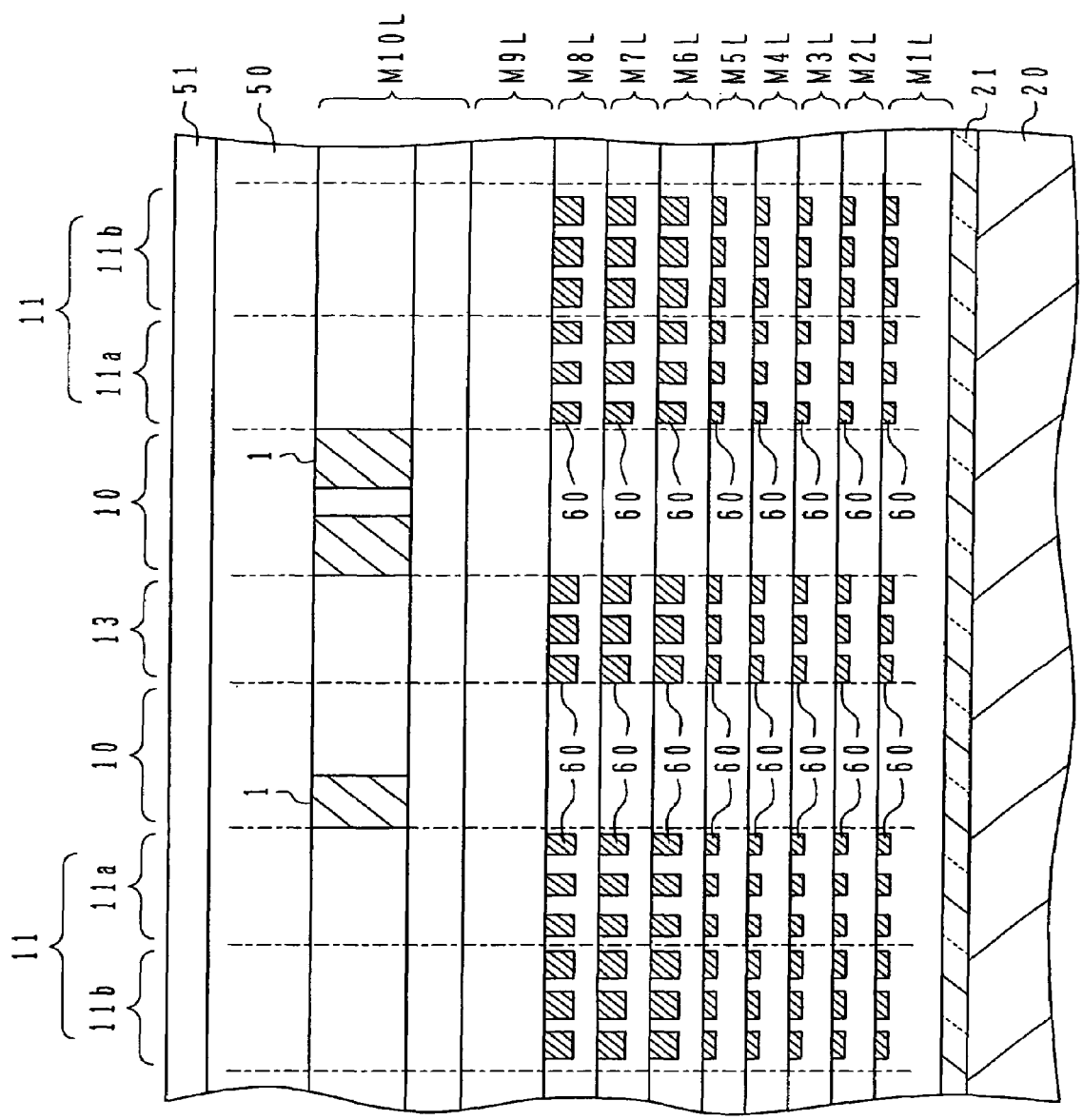
FIG. 3 is a cross sectional view taken along one-dot chain line A3—A3 shown in the plan view of FIG. 1.

FIG. 2 is a cross sectional view taken along one-dot chain line A2—A2 shown in FIG. 1 and showing an adjacent wiring area (third area), and FIG. 3 is a cross sectional view taken along one-dot chain line A3—A3 shown in FIG. 1.

On the surface of a support substrate 20 made of silicon, an element isolation insulating film 21 having a shallow trench isolation (STI) structure is formed. The element isolation insulating film 21 is made of, for example, silicon oxide. A MOSFET 22 is formed in an active region surrounded by the element isolation film 21. A first-layer wiring layer M1L is formed on the support substrate 20, covering MOSFET 22. Nine wiring layers, from a second-layer wiring layer M2L to a tenth-layer wiring layer M10L, are stacked over the first-layer wiring layer M1L. In FIG. 2, wiring layers M1L–M7L may be considered to be intermediate wiring layers, while wiring layers M8L may be considered an upper wiring layer and wiring layer M9L may be considered an other wiring layer.

On the tenth-layer wiring layer M10L, an interlayer insulating film 50 is formed. A pad 52 is formed on a partial area of a surface of the interlayer insulating film 50. A passivation film 51 covers the interlayer insulating film 50 and the pad 52. The passivation film 51 has an opening which exposes the surface of the pad 52. For example, the interlayer insulating film 50 is made of silicon oxide, low dielectric constant insulating material or the like, and the passivation film 51 is made of silicon nitride (SiN).

Figure 4:
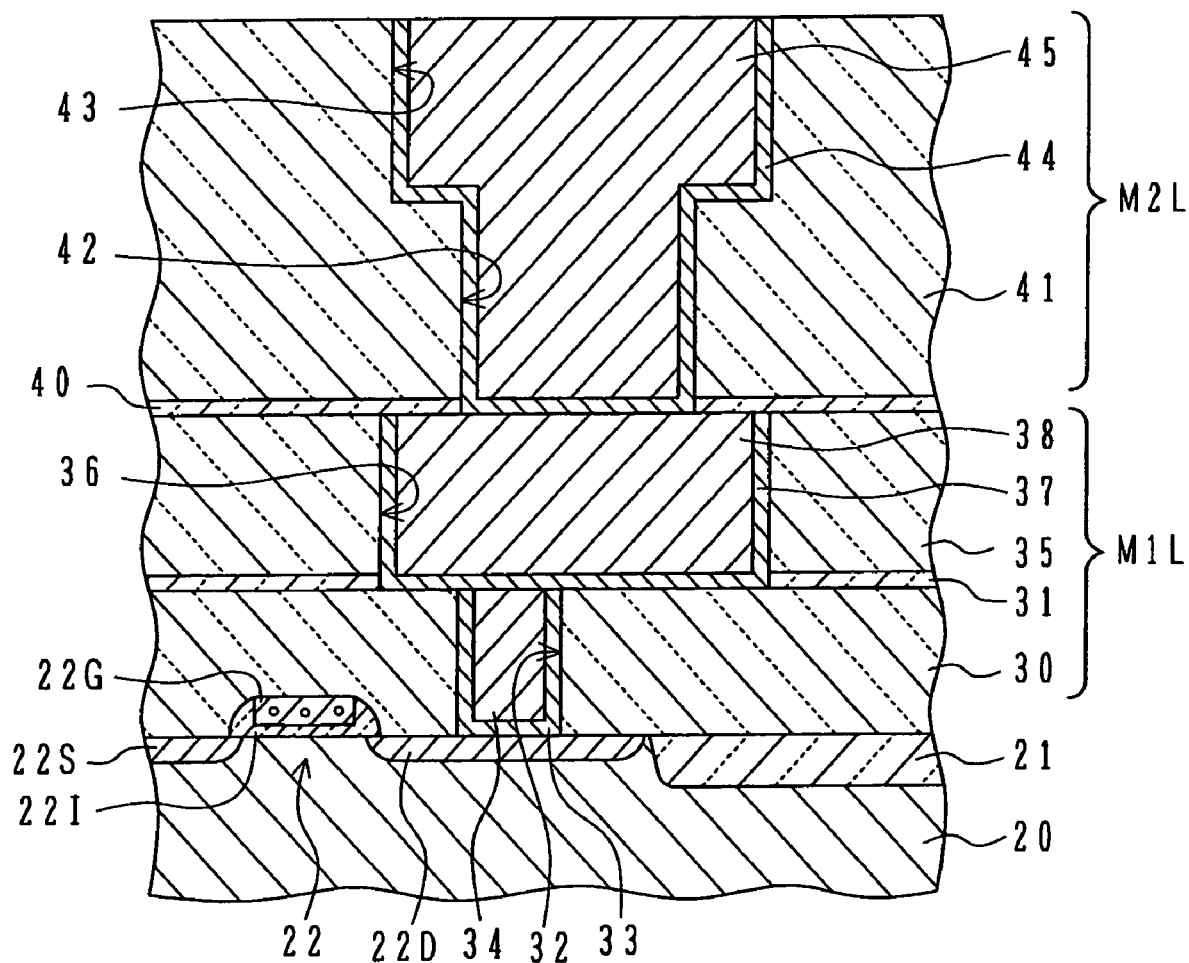
FIG. 4 is a cross sectional view of first and second layers of the multi-layer wiring structure according to the embodiment.

FIG. 4 is a more detailed cross sectional view showing MOSFET 22, first-layer wiring layer M1L and second-layer wiring layer M2L. MOSFET 22 is formed in the active region. MOSFET 22 is constituted of a source region 22S, a drain region 22D, a gate insulating film 221 and a gate electrode 22G.

An interlayer insulating film 30 made of silicon oxide is formed covering MOSFET 22. A via hole 32 bored through the interlayer insulating film 30 is formed at the position corresponding to the drain region 22D. A barrier metal layer 33 made of TiN covers the inner surface of the via hole 32. A plug 43 made of tungsten is filled in the via hole 32.

A stopper film 31 made of, for example, silicon carbide and an interlayer insulating film 35 made of, for example, silicate glass which contains fluorine, are formed on the interlayer insulating film 30. A wiring trench 36 reaching the stopper film 31 is formed in the interlayer insulating film 35. The stopper film 31 exposed on the bottom surface of the wiring trench 36 is etched. The wiring trench 36 passes the area where the plug 34 is disposed. A barrier metal layer 37 made of tantalum covers the bottom and sidewalls of the wiring trench 36. A wiring 38 made of copper is filled in the wiring trench 36. The interlayer insulating film 30, interlayer insulating film 35, plug 34, wiring 38 and the like constitute the first-layer wiring layer M1L.

A barrier layer 40 made of silicon carbide is formed on the first-layer wiring layer M1L. Formed on the barrier layer 40 is an interlayer insulating film 41 made of silicate glass which contains fluorine. A via hole 42 reaching the first-layer wiring layer M1L is formed through the interlayer insulating film 41 and barrier layer 40. A wiring trench 43 is formed in the interlayer insulating film 44 down to an intermediate depth thereof. The wiring trench 43 passes the area where the via hole 42 is disposed.

A barrier metal layer 44 made of Ta covers the inner surfaces of the wiring trench 43 and via hole 42. A wiring 45 made of copper is filled in the wiring trench 43 and via hole 42. The interlayer insulating film 41, wiring 45 and the like constitute the second-layer wiring layer M2L.

The first-layer wiring layer M1L is made of the single damascene method, whereas the second-layer wiring layer M2L is made of the dual damascene method.

Description will be made on a example of a method of forming the second-layer wiring layer by the dual damascene method. The barrier layer 40 is formed on the first-layer wiring layer M1L by CVD. The interlayer insulating film 41 is formed on the barrier layer 40 by CVD. A silicon carbide film (not shown) to be used as an etching mask is formed on the interlayer insulating film 41, and an opening matching the wiring trench 43 is formed through the silicon carbide film. A photoresist film is formed on the silicon carbide film, and an opening matching the via hole 42 is formed through the photoresist film.

By using the resist film as a mask, the interlayer insulating film 41 is etched down to an intermediate depth thereof to form a portion of the via hole 42. After the resist film is removed, by using the already patterned silicon carbide film as a mask, the wiring trench 43 is formed by etching. At this time, the bottom of the partially formed via hole 42 is also etched so that the via hole 42 reaches the barrier layer 40. The silicon carbide film used as the etching mask and the barrier layer 40 exposed on the bottom of the via hole 42 are removed.

The Ta film is formed by sputtering, covering the inner surface of the via hole 42, the inner surface of the wiring trench 43 and the upper surface of the interlayer insulating film 41. A seed layer of copper is formed by sputtering, and then a copper layer is formed by electrolytic plating. CMP is performed until the surface of the interlayer insulating film 41 is exposed to remove unnecessary Ta layer and copper layer. The barrier metal layer 44 of Ta and the wiring 45 of copper are therefore left in the via hole 42 and wiring trench 43.

The materials of the interlayer insulating film, barrier metal, wiring and the like are examples, and other materials may also be used. For example, the material of the interlayer insulating film may be low dielectric constant insulating material such as porous silica.

Description continues reverting to FIGS. 2 and 3. Similar to the second-layer wiring layer M2L, each of the third-layer wiring layer M3L to ninth-layer wiring layer M9L is formed by the dual damascene method. Dummy patterns 60 of copper are disposed in the second area 11 and fourth area 13 of each of the wiring layer M1L to wiring layer M8L. The wiring 38 shown in FIG. 4 is disposed in the third area 12 of the wiring layer M1L, the wiring 45 shown in FIG. 4 is disposed in the third area 12 of the wiring layer M2L, and a wiring 61 is disposed in the third area 12 of each of the wiring layers M3L to M8L. The dummy patterns 60 are formed at the same time when the wiring of the corresponding layer is formed. Conductive patterns such as dummy patterns and wiring patterns are not disposed in the first area 10 of each of the wiring layer M1L to wiring layer M8L.

The lead 3 is disposed in the ninth-layer wiring layer M9L, traversing the first area 10 and second area 11 and reaching the third area 12. A thickness of the wiring layer M9L is, for example, 1 μm. In the third area 12 of the ninth-layer wiring layer M9L, various other wirings (not shown) are disposed. The conductive patterns (wiring and dummy patterns) other than the lead 3 are not disposed in the first area 10, second area 11 and fourth area 13 of the ninth-layer wiring layer M9L.

The tenth-layer wiring layer M10L is disposed on the ninth-layer wiring layer M9L. The wiring layer M10L is formed by the single damascene method.

The inductor 1 is formed in the first area 10 of the tenth-layer wiring layer M10L. The end of the inductor 1 on the inner side is connected to the underlying lead 3 via the plug 4 filled in the via hole. The end of the inductor 1 on the outer side is continuous with the lead 2 disposed in the same layer. The wiring 5 disposed in the third area 12 of the wiring layer M10L is connected to the lead 3 via the plug 6.

The insulating film 50 made of silicon oxide is formed on the tenth-layer wiring layer M10L. A via hole is formed through the insulating film 50 to expose a portion of the underlying wiring 5. A conductive plug 7 of copper is filled in this via hole. The pad 52 of Al or the like is formed on the insulating film 50. The pad 52 is connected to the underlying plug 7. The passivation film 51 made of silicon carbide is formed on the insulating film 50, covering the plug 7. An opening is formed in the passivation film 51 to expose a portion of the pad 52.

Figure 5A:
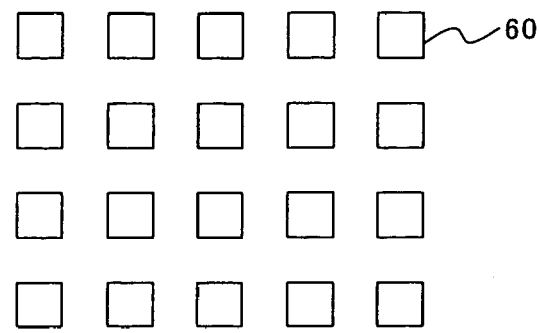
FIGS. 5A to 5C are plan views showing examples of the layout of dummy patterns.

FIG. 5A is a plan view showing an example of dummy patterns. Square dummy patterns 60 are disposed in a matrix shape. The length of a side of one dummy pattern is, for example, 1 μm. A distance between adjacent dummy patterns is, for example, 1.4 μm. In this case, the pattern density is about 17%. The pattern density is defined by Sp/St where St is an area of a predetermined region, and Sp is the total area of dummy patterns disposed in the predetermined region. The size and distance of the dummy patterns described above are one example, and the pattern density can be adjusted by changing the size and distance.

Figure 5B:
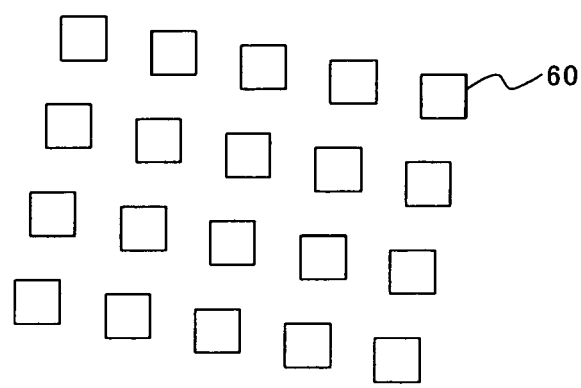

FIG. 5B is a plan view showing another example of dummy patterns. In the example shown in FIG. 5A, the square dummy patterns are disposed in the matrix shape. In the example shown in FIG. 5B, two dummy patterns 60 adjacent along the row direction are displaced along the column direction, and two dummy patterns 60 adjacent along the column direction are also displaced along the row direction. As in this example, the matrix layout may be changed to the layout displaced both along the row and column directions.

Figure 5C:
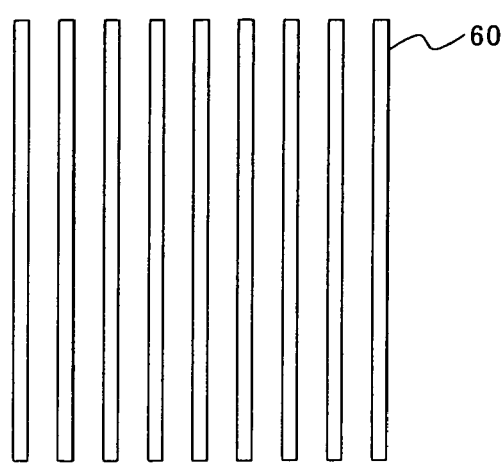

FIG. 5C is a plan view showing another example of dummy patterns. A plurality of straight line dummy patterns 60 is disposed at an equal interval, forming a stripe pattern. The pattern density can be adjusted by changing the width (thickness) of each dummy pattern 60.

Figure 6:
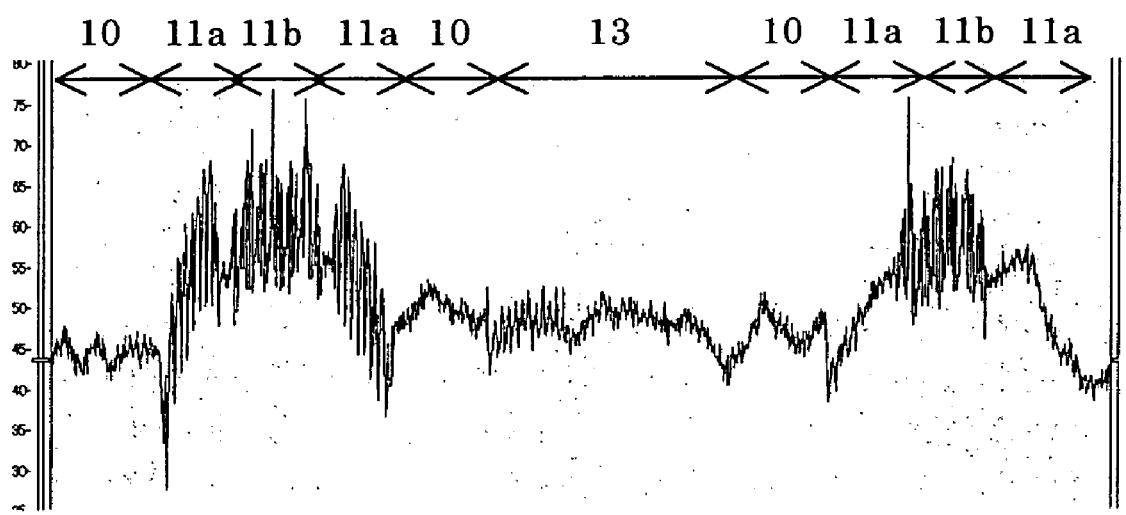
FIG. 6 is a graph showing measurement results of the flatness of a wiring layer surface of a multi-layer wiring structure after CMP according to an embodiment.

FIG. 6 shows the measurement results of the flatness of the surface of the wiring layer M1L after CMP. For the sample to be evaluated, the pattern densities of the first sub area 11a and second sub area 11b of the second area 11 were set to 36% and 38%, respectively, and the pattern density of the fourth area 13 was set to 33%. The matrix shape shown in FIG. 5A was used as the layout of dummy patterns. It can be seen from FIG. 6 that the surface of the first area 10 not disposed with the conductive patterns is depressed more than the surface of the second area 11 disposed with dummy patterns. In this embodiment, dummy patterns are disposed in the fourth area 13. Therefore, the depression of the surface of the first area 10 is shallower than that when conductive patterns are not disposed in the fourth area 13.

With reference to FIGS. 7A to 7D, description will be made on the specific effects when dummy patterns are not disposed in the fourth area 13.

Figure 7C:
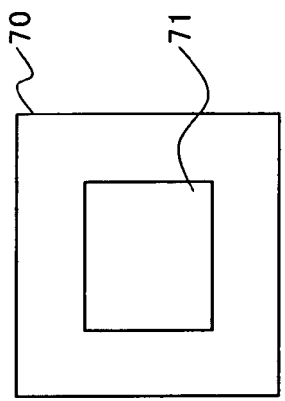
FIGS. 7A and 7C are plan views showing the layouts of a pattern inhibition area and a dummy pattern area of evaluation samples.
Figure 7D:
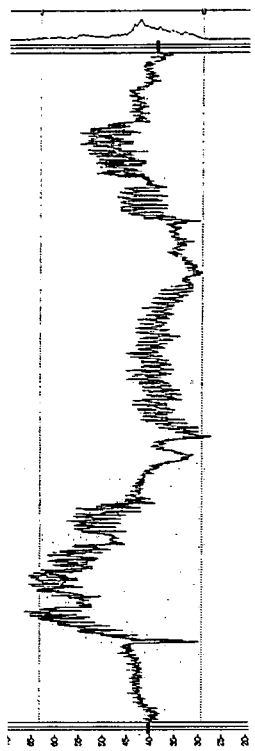
FIGS. 7B and 7D are graphs showing measurement results of the surface flatness of the evaluation samples shown in FIGS. 7A and 7C.
Figure 7A:
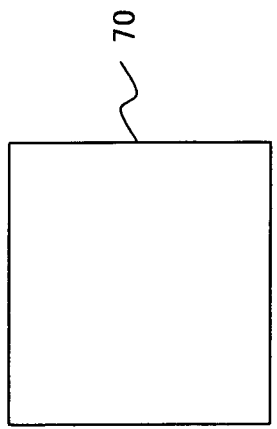

FIGS. 7A and 7C are plan views of evaluation samples used for evaluating the effects of dummy patterns. In the sample shown in FIG. 7A, a pattern inhibition area 70 not disposed with conductive patterns is disposed in an area disposed with dummy patterns at a pattern density of 50%. The pattern inhibition area 70 is a square having a side length of 200 μm. In the sample shown in FIG. 7C, a pattern inhibition area 70 is disposed in an area disposed with dummy patterns at a pattern density of 50%, and further a dummy pattern area 71 disposed with dummy patterns is disposed in the central area of the pattern inhibition area 70. The pattern inhibition area 70 is a square having a side length of 200 μm. The dummy pattern area 71 is a square having a side length of 100 μm and has a pattern density of 20%.

Figure 7B:
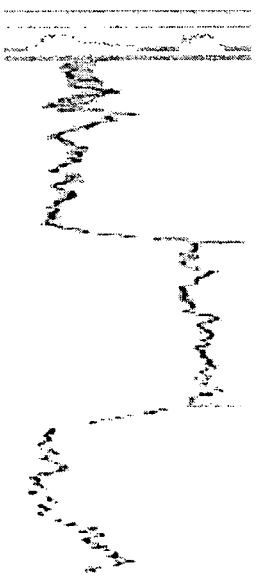

FIGS. 7B and 7D show the measurement results of the flatness of the surface of each evaluation sample after CMP shown in FIGS. 7A and 7C. It can be seen that in both the cases, the surface of the pattern inhibition area 70 is depressed and erosion is formed. However, the step was about 38 nm in the case of the evaluation sample shown in FIG. 7A, whereas the step was about 28 nm in the case of the evaluation sample shown in FIG. 7C. It can be seen that the dummy pattern area 71 in the pattern inhibition area 70 lowers the step.

If the pattern density of the dummy pattern area 71 is too high, the step formed on the border between the pattern inhibition area 70 and dummy pattern area 71 becomes large. Conversely, if the pattern density of the dummy pattern area 71 is too low, the significant effects of disposing the dummy pattern area 71 cannot be obtained. In order to improve the flatness after CMP, it is preferable to set the pattern density of the dummy pattern area 71 to 20 to 40%.

In the above embodiment, since dummy patterns are disposed in the fourth area 13 surrounded by the loop shape first area 10 not disposed with dummy patterns, the step is mitigated like the evaluation samples shown in FIGS. 7C and 7D.

Next, with reference to FIGS. 8A to 8C and FIGS. 9A to 9C, description will be made on the effects of disposing dummy patterns in the second area 11 in the above-described embodiment.

Figure 8A:
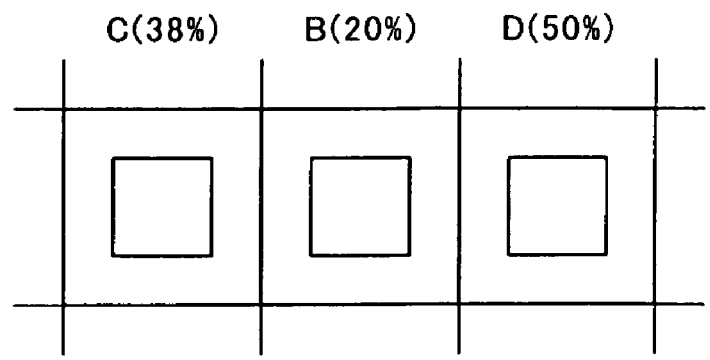
FIGS. 8A to 8C are plan views showing the layouts of a pattern inhibition area and a dummy pattern area of evaluation samples.
Figure 8B:
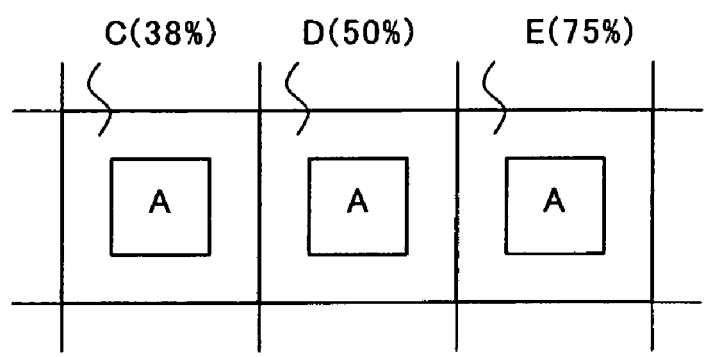
Figure 8C:
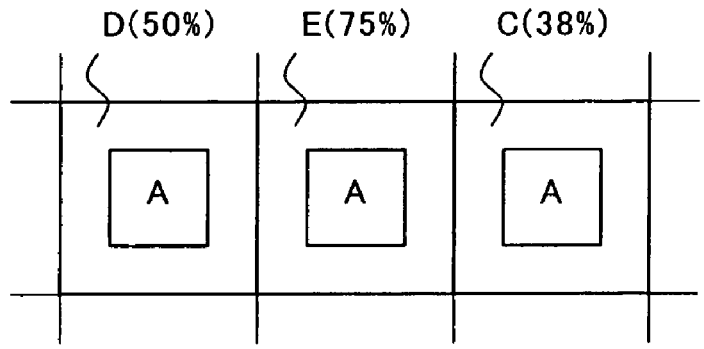

FIGS. 8A to 8C show the layout of conductive patterns disposed in evaluation samples. A plurality of square sections were disposed in a matrix shape. Each section includes a pattern inhibition area A and a dummy pattern area surrounding the pattern inhibition area. A plurality of sections having different pattern densities of the dummy pattern areas were prepared.

FIG. 8A is a plan view showing an area constituted of a section having a dummy pattern area C with a pattern density of 38%, a section having a dummy pattern area B with a pattern density of 20% and a section having a dummy pattern area D with a pattern density of 50%, disposed in this order. FIG. 8B is a plan view showing an area constituted of a section having the dummy pattern area C with the pattern density of 38%, a section having the dummy pattern area D with a pattern density of 50% and a section having a dummy pattern area E with a pattern density of 75%, disposed in this order. FIG. 8C is a plan view showing an area constituted of a section having the dummy pattern area D with the pattern density of 50%, a section having the dummy pattern area E with a pattern density of 75% and a section having the dummy pattern area C with the pattern density of 38%, disposed in this order. The stripe patterns shown in FIG. 5C are disposed in the dummy pattern areas B, D and E, and the matrix shape patterns shown in FIG. 5A are formed in the dummy pattern area C.

Figure 9A:
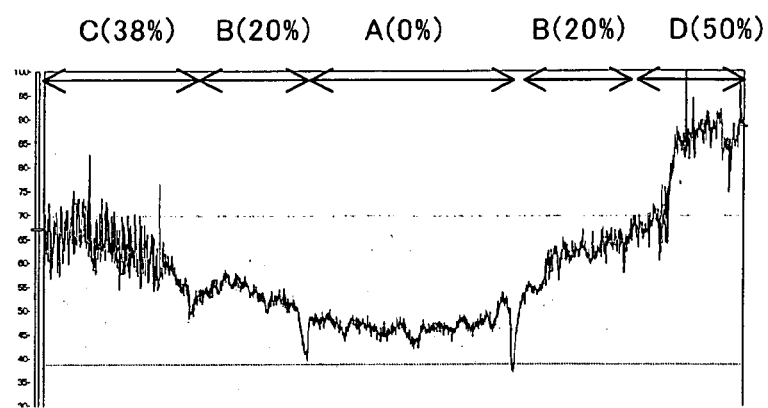
FIGS. 9A to 9C are graphs showing measurement results of the surface flatness of the evaluation samples shown in FIGS. 8A to 8C.
Figure 9B:
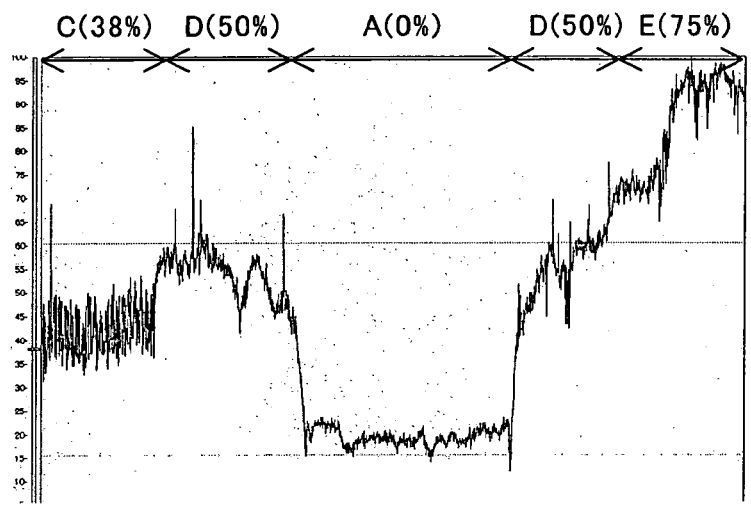
Figure 9C:
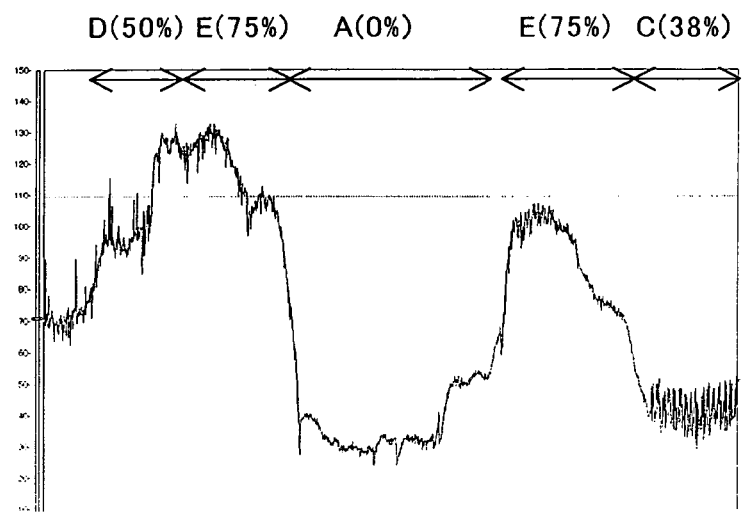

FIGS. 9A to 9C show the measurement results of the flatness of the surface near the central pattern inhibition area A of each evaluation sample after CMP shown in FIGS. 8A to 8C.

It can be seen that the step formed at the border between the pattern inhibition area A and the dummy pattern area in contact with the area A is mitigated in the order of the sample shown in FIG. 9C, the sample shown in FIG. 9B and the sample shown in FIG. 9A. The pattern density of an area where actual wirings are formed is generally 20 to 80%. If a wiring is disposed adjacent to the pattern inhibition area A, the step becomes large as the pattern density of the wiring area becomes high. The step can be mitigated by disposing the dummy pattern area having a pattern density of about 20% around the pattern inhibition area A.

If the pattern density of the dummy pattern area is too low, the effects of disposing the dummy pattern area are reduced. For example, the step mitigating effects can be considered to be approximately equivalent to the structure that the pattern inhibition area is simply expanded. Further, if the pattern density of the dummy pattern area is too high, the step becomes large as shown in FIGS. 9B and 9C. In order to reduce the step, it is preferable to set the pattern density of the dummy pattern area in contact with the pattern inhibition area A to 15% to 30%.

As shown in FIG. 9A, if the dummy pattern area B having the pattern density of 20% is made in contact with the dummy pattern area D having the pattern density of 50%, a step is formed at the border therebetween. In contrast, a large step is not formed at the border between the dummy pattern area B having the pattern density of 20% and the dummy pattern area C having the pattern density of 38%. It can be seen from this evaluation results that in the example of FIG. 9A it is preferable to dispose another dummy pattern area having a slightly higher pattern density in the area outside of the dummy pattern area B. It is preferable to set a difference of the pattern density between adjacent two dummy pattern areas to 15% or smaller.

As the above-described studies are applied to the embodiment shown in FIG. 1, it can be considered that it is preferable to set the pattern density of the first sub area 11a of the second area 11 on the inner periphery side to 15% to 30%. It can be considered that it is preferable to make the pattern density of the second sub area 11 b be higher than the pattern density of the first sub area 11a and set the difference therebetween to 15% or smaller. If sufficient effects can be obtained even if the pattern densities in the second area 11 are made uniform, it is not necessary to divide the second area 11 into a plurality of sub areas having different pattern densities.

If the width of the second area 11 is too narrow, the effects of disposing the second area 11 cannot be expected. It is preferable to set the width of the second area 11 to 0.2 L or wider where L is a side length of the outer periphery of the first area 10. If the outer periphery of the first area 10 is rectangular, the width of the second area 11 is set to 0.2 L or wider where L is the short side length of the rectangle.

In the above-described embodiment, conductive patterns other than the lead 3 extending from the inductor 1 are not disposed in the first area 10 of each wiring layer. Therefore, the electric characteristics of the inductor 1 can be maintained to have desired values. In order to maintain the electric characteristics of the inductor 1 at desired values, it is preferable that conductive patterns such as wiring and dummy patterns are not disposed in the first area 10. Also, in the above-described embodiment, dummy patterns are disposed in the second area 11 in contact with the outer periphery of the loop shape first area 10 and in the fourth area 13 in contact with the inner periphery. It is therefore possible to reduce the step which might be formed in the first area 10 and its surrounding, while the electric characteristics of the inductor 1 are properly maintained.

Dummy patterns are not disposed also in the second area 11 of the wiring layer M9L just under the tenth-layer wiring layer M10L where the inductor 1 is disposed. The dummy patterns 60 are disposed in the eighth-layer wiring layer M8L one layer spaced from the wiring layer M10L disposed with the inductor 1 and in lower wiring layers than the eighth-layer wiring layer. With this arrangement, it is possible to prevent the dummy patterns 60 from becoming near the inductor 1 and maintain properly the electric characteristics of the inductor 11. By incorporating the structure that wiring other than the lead 3 directly extended from the inductor 1 are not disposed near the second area 11 of the ninth-layer wiring layer M9L, it becomes possible to make hard to form a step on the surface of the wiring layer M9L near the area where the inductor 1 is disposed.

The above-described embodiment adopts the structure that conductive patterns other than the lead 3 of the inductor 1 are not disposed in the first area in any of the wiring layers from the first-layer wiring layer M1L to ninth-layer wiring layer M9L. If the distance from the inductor 1 to the conductive pattern becomes long, the influence of the conductive pattern upon the inductor 1 becomes small. Namely, it is preferable not to dispose dummy patterns in the first area 10 of the wiring layer M8L just under the wiring layer M9L disposed with the lead 3 of the inductor 1. The wiring layers of the seventh-layer wiring layer M7L and lower wiring layers are spaced by two layers or more from the inductor 1. Therefore, even if dummy patterns are disposed in the first area 10 of these wiring layers M1L to M7L, the influence upon the inductor 1 is small.

Also in the above-described embodiment, active elements such as MOSFET 22 are formed in the third area 12 of the surface of the support substrate 20, and the element isolation insulating film 21 is formed in the area inclusive of the first area 10 and second area 11. Since active elements are not disposed in an area superposed upon the inductor 1, the influence of the active elements upon the inductor 1 can be avoided.

In the above-described embodiment, the number of turns of the inductor 1 is 1.5 as shown in FIG. 1. Therefore, there is a cross point between the inductor 1 and the lead 3 connected to the end of the inductor 1 on the inner side. In order to avoid a short circuit between the lead 3 and inductor 1 at the cross point, it is necessary to dispose the lead 3 in the wiring layer M9L different from the wiring layer M10L disposed with the inductor 1. If the number of turns of an inductor is about 1, two leads connected to opposite ends of the inductor can be disposed in the same wiring layer as the wiring layer disposed with the inductor. In this case, it is not necessary to dispose the lead 3 in the wiring layer M9L shown in FIG. 2. Conductive patterns such as wiring are not disposed therefore in the first area 10 of the wiring layer M9L.

The present invention has been described in connection with the preferred embodiments. The invention is not limited only to the above embodiments. It will be apparent to those skilled in the art that other various modifications, improvements, combinations, and the like can be made.

We claim:

1. A multi-layer wiring structure comprising:
   a support substrate, on a surface of which a first area, a loop shape second area surrounding the first area, and a third area surrounding the second area are defined;
   an upper wiring layer disposed above the support substrate, the upper wiring layer comprising an interlayer insulating film, recesses formed in the interlayer insulating film in the second area and the third area, a wiring filling the recess in the third area and dummy patterns filling the recess in the second area, and the upper wiring layer not comprising conductive patterns in the first area; and
   a functional element disposed above the upper wiring layer and in the first area.

2. The multi-layer wiring structure according to claim 1, wherein the second area includes a first sub area on a first area side and a second sub area outside of the first sub area, and a pattern density of the first sub area is lower than a pattern density of the second sub area.

3. The multi-layer wiring structure according to claim 1, further comprising an other wiring layer disposed between the upper wiring layer and the functional element, conductive patterns are not formed in the first and second areas of the other wiring layer or only a wiring directly connected to the functional element is formed in the first and second areas of the other wiring layer.

4. The multi-layer wiring structure according to claim 1, further comprising at least one intermediate wiring layer disposed between the support substrate and the upper wiring layer, conductive patterns not being formed in the first area of both the upper wiring layer and the intermediate wiring layer, and dummy patterns being formed in the second area of the upper wiring layer and the intermediate wiring layer.

5. The multi-layer wiring structure according to claim 1, wherein the first area is a loop shape area, the multi-layer wiring structure further comprises a fourth area surrounded by the first area, the functional element is an inductor disposed not in the fourth area but in the first area, and dummy patterns are formed in the fourth area of the upper wiring layer.

6. The multi-layer wiring structure according to claim 5, further comprising at least one intermediate wiring layer disposed between the support substrate and the upper wiring layer, and dummy patterns are formed in the fourth area of both the upper wiring layer and the intermediate wiring layer.

7. The multi-layer wiring structure according to claim 6, wherein conductive patterns are not formed in the first area of both the upper wiring layer and the intermediate wiring layer, and dummy patterns are formed in the second area of the upper wiring layer and the intermediate wiring layer.

8. The multi-layer wiring structure according to claim 1, further comprising:
   a semiconductor active device formed in the third area and on the surface of the support substrate; and
   an element isolation insulating film inclusively covering the first and second areas of the surface of the support substrate.

9. The multi-layer wiring structure according to claim 1, wherein an outer periphery of the first area forms a square or a rectangle, and a width of the second area is at least 0.3 times as large as a length of a side of the square or a short side of the rectangle.

10. A multi-layer wiring structure comprising:
    a support substrate having a loop shape first area, a third area surrounding the first area, and a fourth area surrounded by the first area, respectively defined on a surface of the support substrate;
    an upper wiring layer disposed above the support substrate, the upper wiring layer comprising an interlayer insulating film, recesses formed in the interlayer insulating film in the third area and the fourth area, a wiring filling the recess in the third area and dummy patterns filling the recess in the fourth area, and the upper wiring layer not comprising conductive patterns in the first area; and
    a functional element disposed above the upper wiring layer and in the first area.

11. The multi-layer wiring structure according to claim 10, further comprising an other wiring layer disposed between the upper wiring layer and the functional element, conductive patterns are not formed in the first and fourth areas of the other wiring layer or only a wiring directly connected to the functional element is formed in the first area of the other wiring layer.

12. The multi-layer wiring structure according to claim 10, further comprising at least one intermediate wiring layer disposed between the support substrate and the upper wiring layer, conductive patterns are not formed in the first area of the upper wiring layer and the intermediate wiring layer, and dummy patterns are formed in the fourth area of the upper wiring layer and the intermediate wiring layer.

13. The multi-layer wiring structure according to claim 10, further comprising:
    a semiconductor active device formed in the third area and on the surface of the support substrate; and
    an element isolation insulating film inclusively covering the first and fourth areas of the surface of the support substrate.

* * * * *